US012618905B2

(12) United States Patent (10) Patent No.: US 12,618,905 B2
Li et al. (45) Date of Patent: May 5, 2026

(54) SUPERCONDUCTING MOTOR QUENCH DETECTION METHOD AND APPARATUS BASED ON ROTATIONAL SYMMETRY OF MOTOR

(71) Applicant: QINGDAO UNIVERSITY, Qingdao (CN)

(72) Inventors: Xianglin Li, Qingdao (CN); Shaorui Wang, Qingdao (CN); Mingzhe Sang, Qingdao (CN); Wei Hua, Qingdao (CN); Dongyu Li, Qingdao (CN); Yubin Wang, Qingdao (CN)

(73) Assignee: QINGDAO UNIVERSITY, Qingdao (CN)

( * ) Notice: Subject to any disclaimer, the term of this patent is extended or adjusted under 35 U.S.C. 154(b) by 0 days.

(21) Appl. No.: 19/269,952

(22) Filed: Jul. 15, 2025

(65) Prior Publication Data

US 2025/0341577 A1 Nov. 6, 2025

Related U.S. Application Data

(63) Continuation of application No. PCT/CN2024/117238, filed on Sep. 5, 2024.

(30) Foreign Application Priority Data

Mar. 26, 2024 (CN) .......................... 202410346510.8

(51) Int. Cl.
*G01R 31/34* (2020.01)
*G01R 19/10* (2006.01)
(Continued)

(52) U.S. Cl.
CPC ............. *G01R 31/34* (2013.01); *G01R 19/10* (2013.01); *G01R 19/16576* (2013.01); *H02K 55/00* (2013.01)

(58) Field of Classification Search
CPC .. G01R 31/34; G01R 19/10; G01R 19/16576; H02K 55/00
See application file for complete search history.

(56) References Cited

U.S. PATENT DOCUMENTS

2005/0099253 A1* 5/2005 Bock .................... H10N 60/355
335/100
2011/0082043 A1* 4/2011 Wang ........................ H01F 6/06
324/318
(Continued)

FOREIGN PATENT DOCUMENTS

CN 101975900 A * 2/2011 ............. G01R 31/00
CN 104779841 A * 7/2015 ............. H02N 15/00
(Continued)

*Primary Examiner* — Catherine T. Rastovski
*Assistant Examiner* — Lal Ce Mang
(74) *Attorney, Agent, or Firm* — Nitin Kaushik

(57) ABSTRACT

The present invention discloses a superconducting motor quench detection method and apparatus based on rotational symmetry of a motor, belonging to the technical field of superconducting motor quench detection. The method includes: acquiring terminal voltages of each group of superconducting magnets in a superconducting motor, where the superconducting motor is pre-divided into at least two unit motors by using the rotational symmetry of the motor, and superconducting magnets located at corresponding positions are selected from the at least two unit motors as a group of superconducting magnets; calculating an absolute value of a terminal voltage difference of each group of superconducting magnets; and judging whether the absolute value exceeds a preset threshold, and if the absolute value exceeds the preset threshold, determining that the superconducting magnets are in a quench state. According to the present invention, induced voltages coupled by the terminal voltages of superconducting magnets are eliminated.

8 Claims, 8 Drawing Sheets

Acquire terminal voltages of each group of superconducting magnets in a superconducting motor, where the superconducting motor is pre-divided into at least two unit motors by using the rotational symmetry of the motor, and superconducting magnets located at corresponding positions are selected from the at least two unit motors as a group of superconducting magnets — 101

Calculate an absolute value of a terminal voltage difference of each group of superconducting magnets — 102

Judge whether the absolute value exceeds a preset threshold, and if the absolute value exceeds the preset threshold, determine that the superconducting magnets are in a quench state — 103

(51) Int. Cl.
  *G01R 19/165*  (2006.01)
  *H02K 55/00*   (2006.01)

(56)       References Cited

U.S. PATENT DOCUMENTS

2013/0293987 A1* 11/2013 Joshi ..................... H02H 7/001
                   324/71.6
2019/0339339 A1* 11/2019 Berggren .............. G01R 33/02

FOREIGN PATENT DOCUMENTS

| | | | | | |
|---|---|---|---|---|---|
| CN | 106501740 A | * | 3/2017 | ......... | G01R 33/1238 |
| CN | 106771610 A | * | 5/2017 | ............ | G01R 27/02 |
| JP | 2010199408 A | * | 9/2010 | .............. | H01F 6/00 |
| WO | WO-2004006304 A2 | * | 1/2004 | ............ | H02K 31/02 |

* cited by examiner

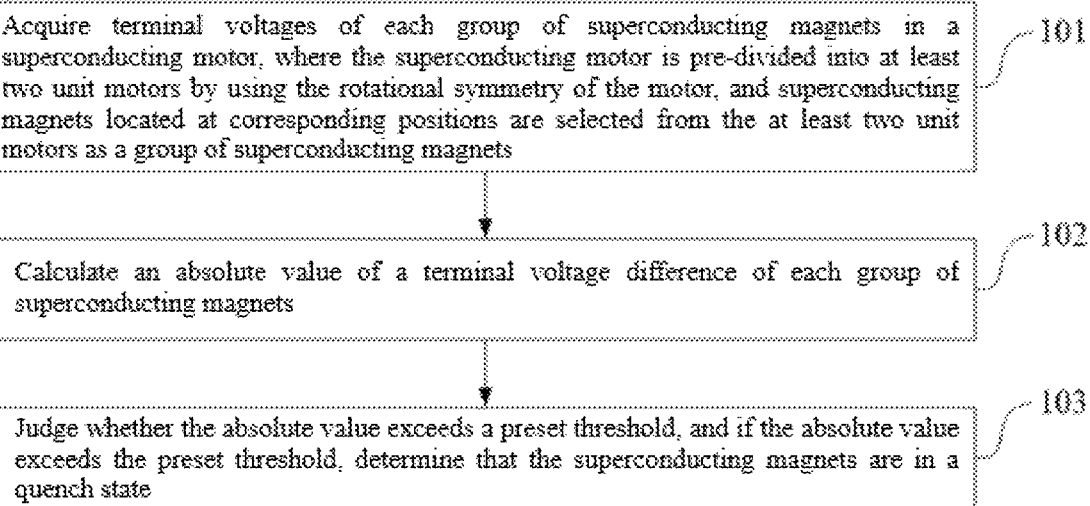

Acquire terminal voltages of each group of superconducting magnets in a superconducting motor, where the superconducting motor is pre-divided into at least two unit motors by using the rotational symmetry of the motor, and superconducting magnets located at corresponding positions are selected from the at least two unit motors as a group of superconducting magnets ⟶ 101

Calculate an absolute value of a terminal voltage difference of each group of superconducting magnets ⟶ 102

Judge whether the absolute value exceeds a preset threshold, and if the absolute value exceeds the preset threshold, determine that the superconducting magnets are in a quench state ⟶ 103

FIG. 1

SUPERCONDUCTING MOTOR QUENCH DETECTION METHOD AND APPARATUS BASED ON ROTATIONAL SYMMETRY OF MOTOR

CROSS-REFERENCE TO RELATED APPLICATIONS

The application claims priority to Chinese patent application No. 2024103465108, filed on Mar. 26, 2024, the entire contents of which are incorporated herein by reference.

TECHNICAL FIELD

The present invention relates to the technical field of superconducting motor quench detection, and specifically, to a superconducting motor quench detection method and apparatus based on rotational symmetry of a motor.

BACKGROUND

Superconducting motors exhibit potential application prospects in high-capacity propulsion systems, high-power direct-driven wind turbines, and other fields due to their advantages of high power density and high efficiency. However, due to external disturbances and other reasons, superconducting magnets used for the superconducting motors may undergo quench faults. When quench occurs in the superconducting magnets, it not only leads to degradation of current-carrying capacity but may also cause irreversible damage to the superconducting motors. Therefore, it is necessary to detect quench faults of the superconducting motors in an early stage, thus avoiding serious consequences caused by the progression of quench degrees of the super-conducting magnets.

At present, superconducting magnet quench detection methods include temperature detection, pressure detection, flow rate detection, ultrasonic wave detection, optical fiber temperature measurement, and voltage detection, etc. For example, the invention patent application Ser. No. 200710175335.7 discloses a superconducting coil quench detection method, No. 202210224963.4 discloses a super-conducting coil quench detection apparatus based on an active power method, No. 202311555618.X discloses a superconducting magnet quench detection system and method based on distributed optical fiber acoustic wave sensing, and No. 202311535540.5 discloses a high-tempera-ture superconductor quench detection method and system based on ultrasonic waveguides, and the like.

Temperature-based detection involves implementing tem-perature detection of the superconducting magnets by arranging thermocouples or other temperature sensors on the superconducting magnets. This method can only detect temperature variations at a certain point, requiring increased installation density of the sensors to achieve detection of the overall magnets, which poses certain difficulties. In addition, temperature detection has a lag and can only be used as a backup quench detection method. Pressure detection and flow rate detection involve performing quench detection on the superconducting magnets by detecting quench of varia-tions in pressure and flow rates of coolants in cooling pipelines, which has a large lag and poor reliability. Signals detected by ultrasonic wave detection methods are weak and susceptible to external interference, resulting in poor reli-ability. Optical fiber temperature measurement involves implementing temperature variation detection on the superconducting magnets by detecting reflected wave parameters of optical fibers installed on the superconducting magnets, requiring higher equipment costs. Conventional quench detection methods based on voltage signals offer operational convenience. However, due to the presence of excitation magnetic fields and armature magnetic fields in the super-conducting motors, terminal voltages of the superconducting magnets are coupled with induced voltage components, which leads to decrease in accuracy and reliability of the quench detection methods based on the voltage signals. Therefore, how to solve the problem of induced voltage interference is a current research focus in the quench detec-tion methods based on the voltage signals.

SUMMARY

The technical problem to be solved by the present inven-tion is to provide a superconducting motor quench detection method and apparatus based on rotational symmetry of a motor, aiming to solve the problem of induced voltage interference encountered when existing quench detection methods based on voltage signals are applied to a supercon-ducting motor.

To solve the above technical problem, the present inven-tion provides the following technical solutions:

In one aspect, a superconducting motor quench detection method based on rotational symmetry of a motor is pro-vided, including:

step 101: acquiring terminal voltages of each group of superconducting magnets in a superconducting motor, where the superconducting motor is pre-divided into at least two unit motors by using the rotational symmetry of the motor, and superconducting magnets located at corresponding positions are selected from the at least two unit motors as a group of superconducting mag-nets;

step 102: calculating an absolute value of a terminal voltage difference of each group of superconducting magnets; and step 103: judging whether the absolute value exceeds a preset threshold, and if the absolute value exceeds the preset threshold, determining that the superconducting magnets are in a quench state.

In another aspect, a superconducting motor quench detec-tion apparatus based on rotational symmetry of a motor is provided, where the superconducting motor quench detec-tion apparatus is used for a superconducting motor and includes:

an acquisition module, configured to acquire terminal voltages of each group of superconducting magnets in the superconducting motor, where the superconducting motor is pre-divided into at least two unit motors by using the rotational symmetry of the motor, and super-conducting magnets located at corresponding positions are selected from the at least two unit motors as a group of superconducting magnets;

a calculation module, configured to calculate an absolute value of a terminal voltage difference of each group of superconducting magnets; and a judgment module, configured to judge whether the absolute value exceeds a preset threshold, and if the absolute value exceeds the preset threshold, to deter-mine that the superconducting magnets are in a quench state.

The present invention has the following beneficial effects: the present invention provides a superconducting motor quench detection method and apparatus based on rotational symmetry of a motor, including: first, acquiring terminal voltages of each group of superconducting magnets in a superconducting motor, where the superconducting motor is pre-divided into at least two unit motors by using the rotational symmetry of the motor, and superconducting magnets located at corresponding positions are selected from the at least two unit motors as a group of superconducting magnets; second, calculating an absolute value of a terminal voltage difference of each group of superconducting magnets; and finally, judging whether the absolute value exceeds a preset threshold, and if the absolute value exceeds the preset threshold, determining that the superconducting magnets are in a quench state. According to the present invention, the detection of the terminal voltages of the superconducting magnets is non-invasive, the terminal voltages of the superconducting magnets can be quite easily acquired in engineering applications, and variations in the terminal voltages of the superconducting magnets can also intuitively and quickly reflect the occurrence of a quench phenomenon. According to the present invention, the terminal voltages of the superconducting magnets in the superconducting motor are subjected to subtraction after grouping, the differences of the terminal voltages of the superconducting magnets after being processed do not contain induced voltage components, which avoids the interference of induced voltages on the quench detection methods based on the voltage signals and improves the accuracy and reliability of the quench detection methods based on the voltage signals when applied to the superconducting motor. In addition, the present invention performs quench detection on the superconducting motor based on the terminal voltages of the superconducting magnets, without the need for additional modifications to a structure of the superconducting motor.

BRIEF DESCRIPTION OF THE DRAWINGS

FIG. 1 shows a schematic flowchart of a superconducting motor quench detection method based on rotational symmetry of a motor according to the present invention;

4

Figure 8:
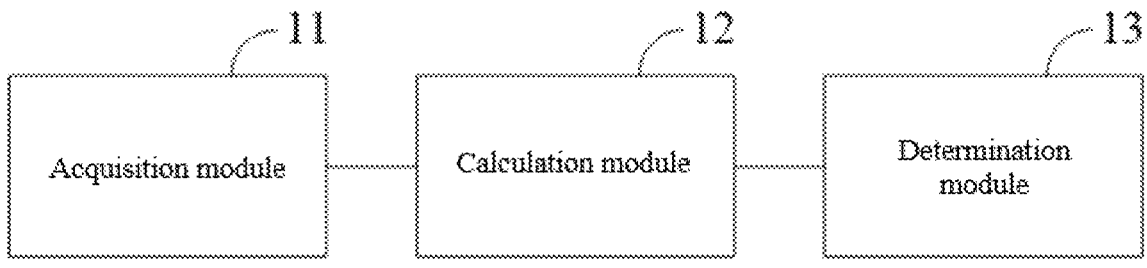

FIG. 8 shows a schematic structural diagram of a superconducting motor quench detection apparatus based on rotational symmetry of a motor according to the present invention.

DETAILED DESCRIPTION OF THE EMBODIMENTS

To explain the technical problems to be solved by the present invention and the technical solutions and advantages of the present invention more clearly, the present invention will be described in detail below with reference to the accompanying drawings and specific embodiments.

In one aspect, the present invention provides a superconducting motor quench detection method based on rotational symmetry of a motor. As shown in FIG. 1, the method includes:

step 101: acquiring terminal voltages of each group of superconducting magnets in a superconducting motor, where the superconducting motor is pre-divided into at least two unit motors by using the rotational symmetry of the motor, and superconducting magnets located at corresponding positions are selected from the at least two unit motors as a group of superconducting magnets.

According to the present invention, the superconducting motor is divided into a plurality of unit motors by using the rotational symmetry of the motor, the superconducting magnets located at the corresponding positions of each unit motor are divided into a group, and the terminal voltages of each group of superconducting magnets are collected for subsequent processing and judgment.

As an optional embodiment, the superconducting motor can consist of T unit motors arranged at intervals of 360°/T and having a same structure, T is greater than or equal to 2 (T being an integer, preferably an even number), each unit motor has N superconducting magnets distributed from a position 1 to a position N (N being an integer), and the superconducting magnets located at the corresponding positions in each unit motor have a same geometric structure and are arranged at intervals of 360°/T in the superconducting motor.

As another optional embodiment, the step 101 can include:

dividing the superconducting magnets located at the corresponding positions in the T unit motors into a group, where each unit motor has N superconducting magnets, so that all superconducting magnets can be divided into N groups, and each group of superconducting magnets consist of T superconducting magnets; and subsequently acquiring the terminal voltages of each group of superconducting magnets in real time:

$$
\begin{array}{llllll}
\text{a group 1:} & u_{11} & u_{12} & \ldots & u_{1t} & \ldots & u_{1T} \\
\text{a group 2:} & u_{21} & u_{22} & \ldots & u_{2t} & \ldots & u_{2T} \\
& \vdots & \vdots & \vdots & \vdots & & \vdots \\
\text{a group } n\text{:} & u_{n1} & u_{n2} & \ldots & u_{nt} & \ldots & u_{nT}
\end{array}
$$

-continued $$\vdots \quad \vdots \quad \vdots \quad \vdots \quad \vdots$$

a group $N$: $u_{N1} \quad u_{N2} \quad ... \quad u_{Nt} \quad ... \quad u_{NT}$ where n represents the positions of the superconducting magnets located in the unit motors, t represents the unit motors where the superconducting magnets are located, and $u_{nt}$ is a terminal voltage of a superconducting magnet located at a position n in a unit motor t.

Figure 2:
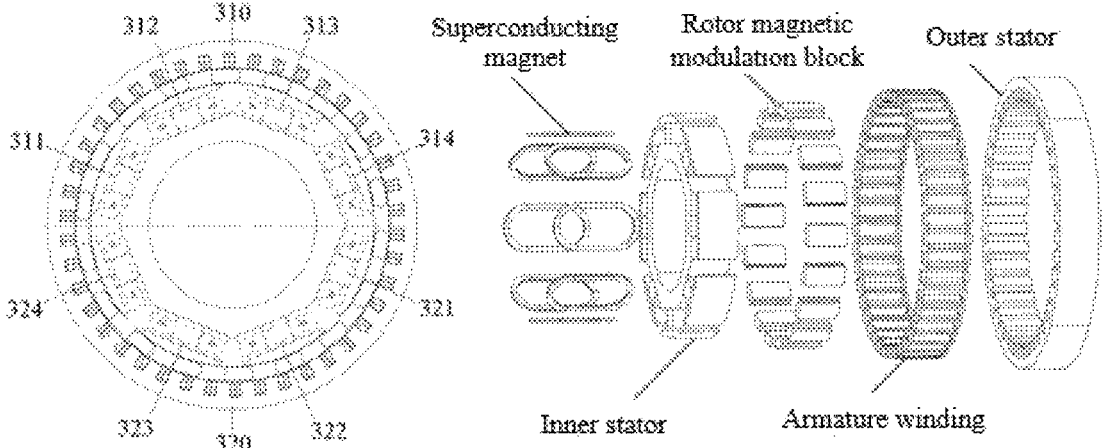
FIG. 2 shows a structural model diagram of a superconducting motor, which is a research object of an instance of the present invention.
Figure 3:
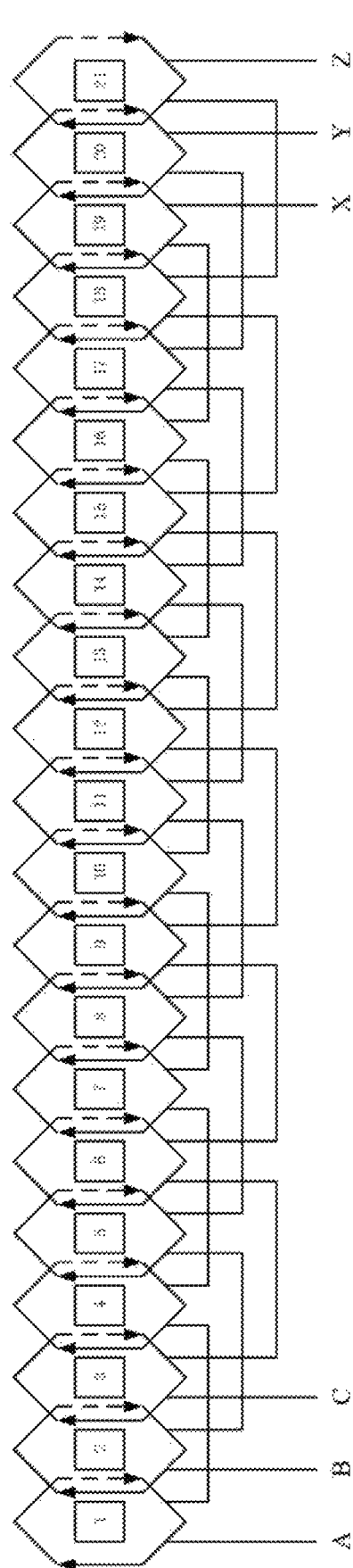
FIG. 3 shows a developed diagram of an armature winding for a superconducting motor, which is a research object of an instance of the present invention.

During specific implementation, in an instance of the present invention, a structural model of the superconducting motor can be shown in FIG. 2 and FIG. 3. The superconducting motor is divided into two unit motors (a unit motor 310 and a unit motor 320) by using the rotational symmetry of the motor, and the two unit motors are arranged at intervals of 180° and have the same structure. Four superconducting magnets are provided in the unit motor 310, namely, a superconducting magnet 311 located at a position 1, a superconducting magnet 312 located at a position 2, a superconducting magnet 313 located at a position 3, and a superconducting magnet 314 located at a position 4. Four superconducting magnets are provided in the unit motor 320, namely, a superconducting magnet 321 located at a position 1, a superconducting magnet 322 located at a position 2, a superconducting magnet 323 located at a position 3, and a superconducting magnet 324 located at a position 4. The superconducting magnets located at the corresponding positions in the two unit motors are divided into a group, and each unit motor has four superconducting magnets, so that all superconducting magnets can be divided into four groups, and each group of superconducting magnets consist of the superconducting magnets located at the corresponding positions in the two unit motors. Subsequently, the terminal voltage of each superconducting magnet is collected in real time:

| a group 1: | $u_{11}\ u_{12}$ |
|---|---|
| a group 2: | $u_{21}\ u_{22}$ |
| a group 3: | $u_{31}\ u_{32}$ |
| a group 4: | $u_{41}\ u_{42}$ |

Figure 4:
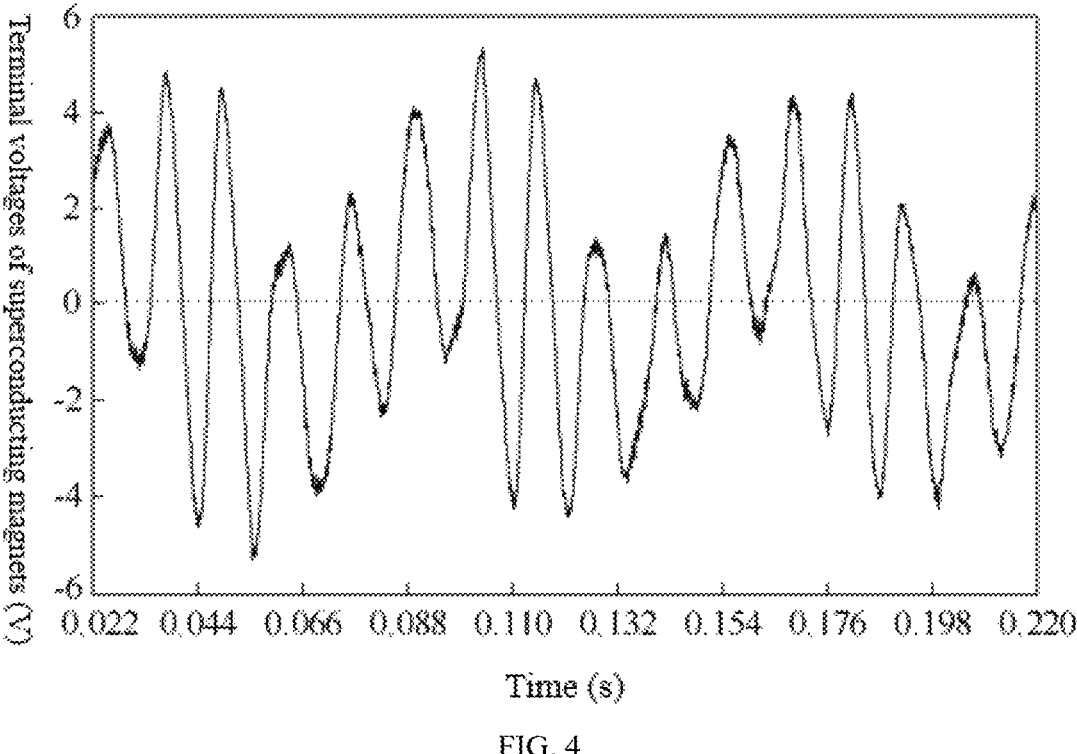
FIG. 4 shows a waveform diagram of terminal voltages of superconducting magnets for a superconducting motor according to an instance of the present invention when no quench occurs.

At this time, the terminal voltage of the superconducting magnet is coupled with an induced voltage. FIG. 4 shows a waveform of the collected terminal voltage of the superconducting magnet 311. An amplitude of the terminal voltage of the superconducting magnet without any processing far exceeds the preset threshold. At this time, the quench detection methods based on the voltage signals cannot be directly applied, and the following steps are required for further processing the terminal voltage of the superconducting magnet.

Step 102: calculating an absolute value of a terminal voltage difference of each group of superconducting magnets.

As an optional embodiment, the step 102 can include:

calculating N groups of terminal voltages of the superconducting magnets according to the following expression to obtain N groups of terminal voltage differences:

a group 1: $\quad U_{112} = u_{11} - u_{12} \quad U_{123} = u_{12} - u_{13} \quad ... \quad U_{1t(t+1)} = u_{1t} - u_{1(t+1)} \quad ... \quad U_{1T1} = u_{1T} - u_{11}$ a group 2: $\quad U_{212} = u_{21} - u_{22} \quad U_{223} = u_{22} - u_{23} \quad ... \quad U_{2t(t+1)} = u_{2t} - u_{2(t+1)} \quad ... \quad U_{2T1} = u_{2T} - u_{21}$ $$\vdots \qquad \vdots \qquad \vdots \qquad \vdots \qquad \vdots$$

a group $n$: $\quad U_{n12} = u_{n1} - u_{n2} \quad U_{n23} = u_{n2} - u_{n3} \quad ... \quad U_{nt(t+1)} = u_{nt} - u_{n(t+1)} \quad ... \quad U_{nT1} = u_{nT} - u_{n1}$ $$\vdots \qquad \vdots \qquad \vdots \qquad \vdots \qquad \vdots$$

a group $N$: $\quad U_{N12} = u_{N1} - u_{N2} \quad U_{N23} = u_{N2} - u_{N3} \quad ... \quad U_{Nt(t+1)} = u_{Nt} - u_{N(t+1)} \quad ... \quad U_{NT1} = u_{NT} - u_{N1}$ where $U_{nt(t+1)}$ is a difference between a terminal voltage of the superconducting magnet located at the position n in the unit motor t and a terminal voltage of a superconducting magnet located at a position n in a unit motor t+1;

subsequently calculating the absolute values of the terminal voltage differences to obtain:

| a group 1: | $|U_{112}|$ | $|U_{123}|$ | ... $|U_{1t(t+1)}|$ | ... | $|U_{1T1}|$ |
|---|---|---|---|---|---|
| a group 2: | $|U_{212}|$ | $|U_{223}|$ | ... $|U_{2t(t+1)}|$ | ... | $|U_{2T1}|$ |
| a group n: | $|U_{n12}|$ | $|U_{n23}|$ | ... $|U_{nt(t+1)}|$ | ... | $|U_{nT1}|$ |
| a group N: | $|U_{N12}|$ | $|U_{N23}|$ | ... $|U_{Nt(t+1)}|$ | ... | $|U_{NT1}|$ | so as to obtain the absolute values of the terminal voltage differences.

Figure 5:
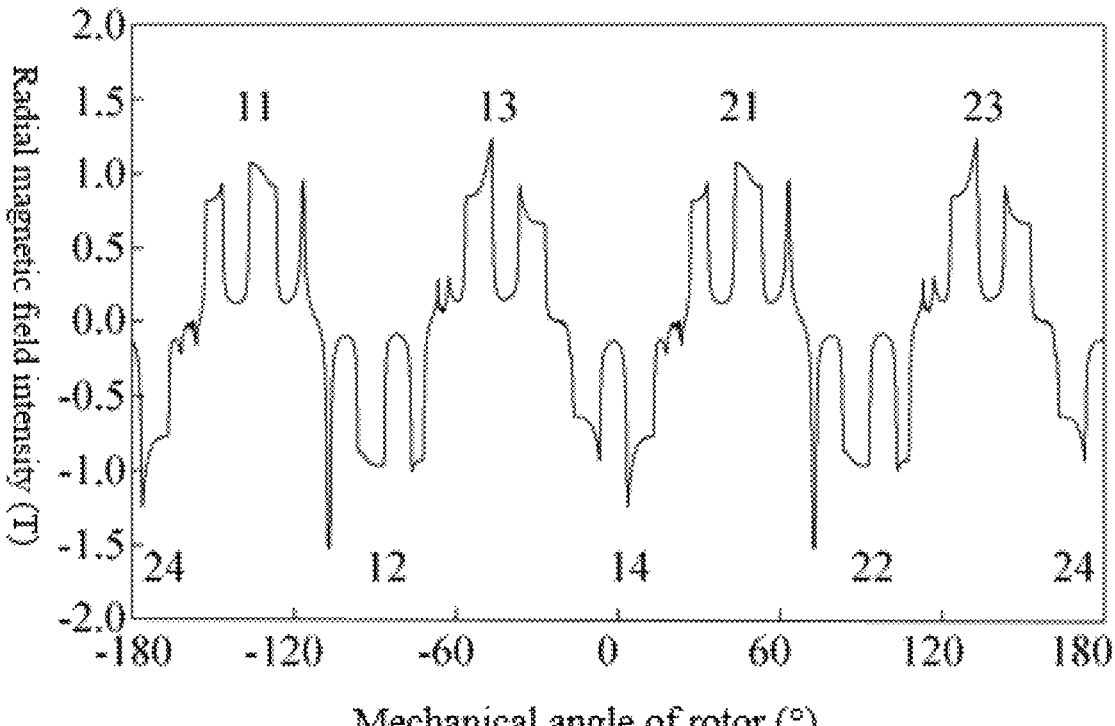
FIG. 5 shows a diagram of radial magnetic field intensity of a superconducting motor according to an instance of the present invention.
Figure 6:
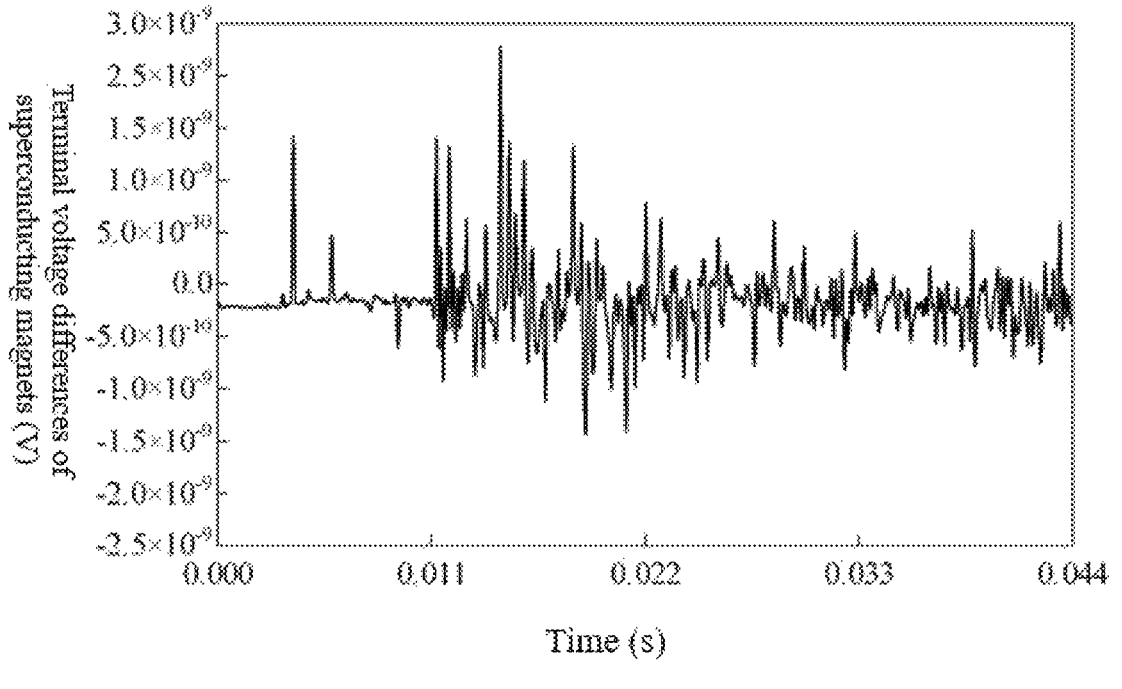
FIG. 6 shows a waveform diagram of terminal voltages of superconducting magnets for a superconducting motor according to an instance of the present invention when no quench occurs.

In the aforementioned instance, as shown in FIG. 5, magnetic fields passing through the superconducting magnet 311 located at the position 1 in the unit motor 1 and the superconducting magnet 321 located at the position 1 in the unit motor 2 have the same waveform and variation process. Therefore, induced voltage components in the two superconducting magnets have the same variation process. Based on such feature, the terminal voltages of the four groups of superconducting magnets can be calculated in this step according to the following expression, so as to obtain four groups of terminal voltage differences:

a group 1:  $U_{112} = u_{11} - u_{12}$   $U_{121} = u_{12} - u_{11}$ a group 2:  $U_{212} = u_{21} - u_{22}$   $U_{221} = u_{22} - u_{21}$ a group 3:  $U_{312} = u_{31} - u_{32}$   $U_{321} = u_{32} - u_{31}$ a group 4:  $U_{412} = u_{41} - u_{42}$   $U_{421} = u_{42} - u_{41}$ FIG. 6 shows a schematic waveform diagram of $U_{112}$. At this time, neither the superconducting magnet 311 nor the superconducting magnet 312 is subjected to quench, and at this time, the terminal voltage difference $U_{112}$ is much less than the preset threshold of 2 mV for the superconducting magnets used in the superconducting motor of the present invention, which will not cause misjudgment of quench. subsequently calculating the absolute values of the terminal voltage differences to obtain:

| a group 1: | $|U_{112}|$ | $|U_{121}|$ |
|---|---|---|
| a group 2: | $|U_{212}|$ | $|U_{221}|$ |
| a group 3: | $|U_{312}|$ | $|U_{321}|$ |
| a group 4: | $|U_{412}|$ | $|U_{421}|$ | step 103: judging whether the absolute value exceeds a preset threshold, and if the absolute value exceeds the preset threshold, determining that the superconducting magnets are in a quench state.

In this step, if the absolute value does not exceed the preset threshold, it is determined that the superconducting magnets are not in a quench state.

As an optional embodiment, the step 103 can include:

comparing the obtained absolute values of the terminal voltage differences with the preset threshold, if both $|U_{n(t-1)t}|$ and $|U_{nt(t+1)}|$ are greater than the preset threshold, considering that the superconducting magnet located at the position n in the unit motor t is in the quench state.

At this time, if the absolute value does not exceed the preset threshold, it is considered that the superconducting magnet located at the position n in the unit motor t is not in the quench state.

Figure 7:
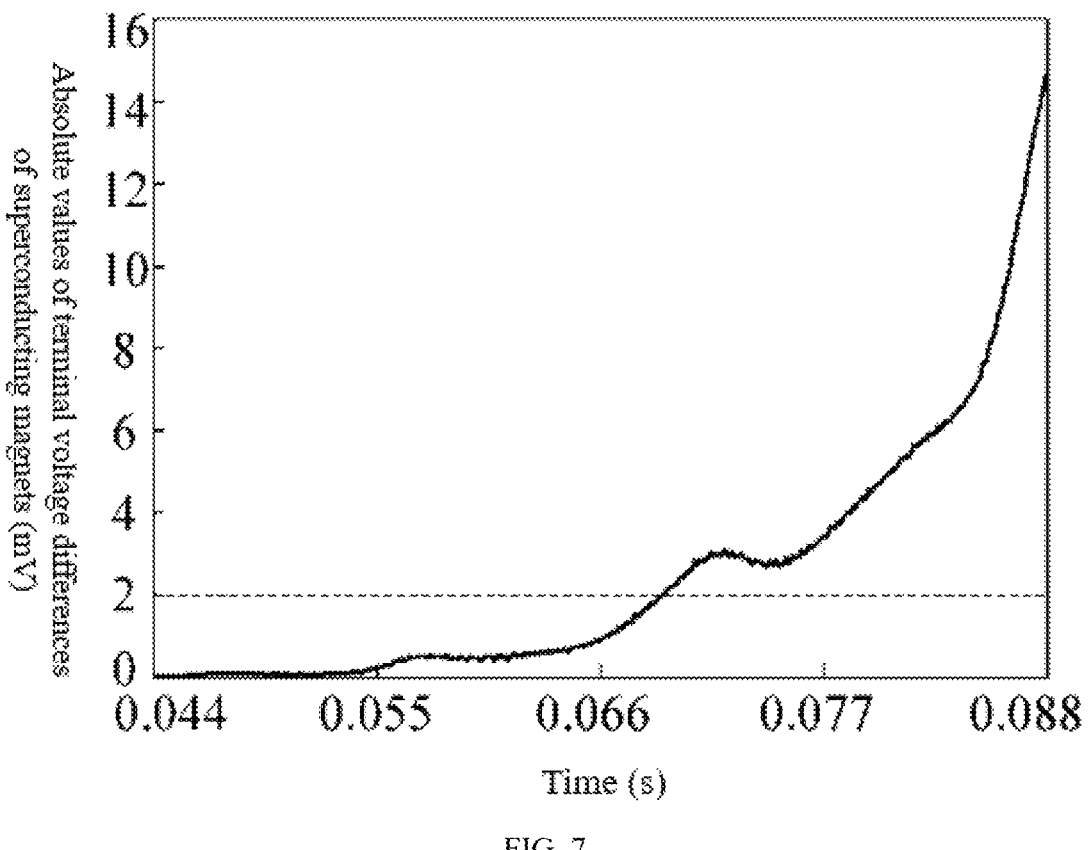
FIG. 7 shows a waveform diagram of absolute values of terminal voltage differences of superconducting magnets according to an instance of the present invention.

In the aforementioned instance, FIG. 7 shows waveforms of $|U_{112}|$ and $|U_{121}|$, with a dashed line indicating a preset threshold of 2 mV. The absolute values $|U_{112}|$ and $|U_{121}|$ of the terminal voltage differences are compared with the preset threshold. If both $|U_{112}|$ and $|U_{121}|$ are greater than the preset threshold, it is considered that the superconducting magnet 311 located at the position 1 in the unit motor 1 and the superconducting magnet 321 located at the position 1 in the unit motor 2 are both in the quench state. Other groups of superconducting magnets are also subjected to quench detection according to the same process as the superconducting magnet 311 and the superconducting magnet 321.

Compared with the prior art, the beneficial effects of the present invention are as follows:

(1) According to the superconducting motor quench detection method based on rotational symmetry of a motor proposed by the present invention, quench detection is performed by using the terminal voltages of the superconducting magnets. The detection of the voltage signals is non-invasive, and the voltage signals can be quite easily acquired in engineering applications, which overcomes the difficulties of invasive methods to detect signals inside the motor. In addition, the voltage signals have a high response speed and can quickly and intuitively reflect the generation of quench resistance when the superconducting magnet is subjected to quench. The quench detection methods based on the voltage signals have the advantage of high response speed when applied to the superconducting motor.

(2) According to the superconducting motor quench detection method based on rotational symmetry of a motor proposed by the present invention, the accuracy and reliability of diagnosing quench faults by using the voltage signals can be improved. Existing quench detection methods based on the voltage signals are interfered by the induced voltages, resulting in low accuracy and reliability. According to the present invention, terminal voltage signals of the superconducting magnets inside the superconducting motor are subjected to subtraction, such that the induced voltage components coupled in the terminal voltage differences can be eliminated, and thus the quench detection methods based on the voltage signals can be reliably applied in the superconducting motor and can detect the quench faults of the superconducting magnets in the superconducting motor.

(3) According to the superconducting motor quench detection method based on rotational symmetry of a motor proposed by the present invention, the induced voltages coupled by the terminal voltages of the superconducting magnets for the superconducting motor are eliminated by means of detecting the terminal voltages of the superconducting magnets. The reliability and accuracy of a voltage-based quench detection method when applied to the superconducting motor are improved. Moreover, the method is convenient to implement and does not require additional modifications to a topological structure of the superconducting motor.

In another aspect, the present invention provides a superconducting motor quench detection apparatus based on rotational symmetry of a motor, used for a superconducting motor. As shown in FIG. 8, the superconducting motor quench detection apparatus includes:

an acquisition module 11, configured to acquire terminal voltages of each group of superconducting magnets in the superconducting motor, where the superconducting motor is pre-divided into at least two unit motors by using the rotational symmetry of the motor, and superconducting magnets located at corresponding positions are selected from the at least two unit motors as a group of superconducting magnets;

a calculation module 12, configured to calculate an absolute value of a terminal voltage difference of each group of superconducting magnets; and a judgment module 13, configured to judge whether the absolute value exceeds a preset threshold, and if the absolute value exceeds the preset threshold, to determine that the superconducting magnets are in a quench state.

The apparatus of this embodiment can be used to execute the technical solutions of a method embodiment shown in FIG. 1, and implementation principles and technical effects thereof are similar to that of the method embodiment, which will not be repeated herein.

Preferably, the superconducting motor can consist of T unit motors arranged at intervals of 360°/T and having a same structure, T is greater than or equal to 2 (T being an integer, preferably an even number), each unit motor has N superconducting magnets distributed from a position 1 to a position N (N being an integer), and the superconducting magnets located at the corresponding positions in each unit motor have a same geometric structure and are arranged at intervals of 360°/T in the superconducting motor.

Preferably, the acquisition module 11 can include:

an acquisition sub-module, configured to divide the superconducting magnets located at the corresponding positions in the T unit motors into a group, each unit motor having N superconducting magnets, to divide all superconducting magnets into N groups, each group of superconducting magnets consisting of T superconducting magnets, and to subsequently acquire the terminal voltages of each group of superconducting magnets in real time:

$$
\begin{array}{llllll}
\text{a group 1:} & u_{11} & u_{12} & \ldots & u_{1t} & \ldots & u_{1T} \\
\text{a group 2:} & u_{21} & u_{22} & \ldots & u_{2t} & \ldots & u_{2T} \\
& \vdots & \vdots & \vdots & \vdots & \vdots \\
\text{a group } n: & u_{n1} & u_{n2} & \ldots & u_{nt} & \ldots & u_{nT} \\
& \vdots & \vdots & \vdots & \vdots & \vdots \\
\text{a group } N: & u_{N1} & u_{N2} & \ldots & u_{Nt} & \ldots & U_{NT}
\end{array}
$$

where n represents the positions of the superconducting magnets located in the unit motors, t represents the unit motors where the superconducting magnets are located, and $u_{nt}$ is a terminal voltage of a superconducting magnet located at a position n in a unit motor t.

Preferably, the calculation module 12 can include:

a calculation sub-module, configured to calculate N groups of terminal voltages of the superconducting magnets according to the following expression to obtain N groups of terminal voltage differences:

$$
\text{a group 1:} \quad U_{112} = u_{11} - u_{12} \quad U_{123} = u_{12} - u_{13} \quad \ldots \quad U_{1t(t+1)} = u_{1t} - u_{1(t+1)} \quad U_{1T1} = u_{1T} - u_{11}
$$

$$
\text{a group 2:} \quad U_{212} = u_{21} - u_{22} \quad U_{223} = u_{22} - u_{23} \quad \ldots \quad U_{2t(t+1)} = u_{2t} - u_{2(t+1)} \quad U_{2T1} = u_{2T} - u_{21}
$$

$$
\vdots \qquad \vdots \qquad \vdots \qquad \vdots \qquad \vdots
$$

$$
\text{a group } n: \quad U_{n12} = u_{n1} - u_{n2} \quad U_{n23} = u_{n2} - u_{n3} \quad \ldots \quad U_{nt(t+1)} = u_{nt} - u_{n(t+1)} \quad U_{nT1} = u_{nT} - u_{n1}
$$

$$
\vdots \qquad \vdots \qquad \vdots \qquad \vdots \qquad \vdots
$$

$$
\text{a group } N: \quad U_{N12} = u_{N1} - u_{N2} \quad U_{N23} = u_{N2} - u_{N3} \quad \ldots \quad U_{Nt(t+1)} = u_{Nt} - u_{N(t+1)} \quad U_{NT1} = u_{NT} - u_{N1}
$$

where $U_{nt(t+1)}$ is a difference between a terminal voltage of the superconducting magnet located at the position n in the unit motor t and a terminal voltage of a superconducting magnet located at a position n in a unit motor t+1;

to subsequently calculate the absolute values of the terminal voltage differences to obtain:

a group 1: $|U_{112}|$ $|U_{123}|$ ... $|U_{1t(t+1)}|$ ... $|U_{1T1}|$ a group 2: $|U_{212}|$ $|U_{223}|$ ... $|U_{2t(t+1)}|$ ... $|U_{2T1}|$ $\vdots$ $\vdots$ $\vdots$ $\vdots$ $\vdots$ a group n: $|U_{n12}|$ $|U_{n23}|$ ... $|U_{nt(t+1)}|$ ... $|U_{nT1}|$ $\vdots$ $\vdots$ $\vdots$ $\vdots$ $\vdots$ a group N: $|U_{n12}|$ $|U_{N23}|$ ... $|U_{Nt(t+1)}|$ ... $|U_{NT1}|$ so as to obtain the absolute values of the terminal voltage differences.

Preferably, the judgment module 13 can include:

a judgment sub-module, configured to compare the obtained absolute values of the terminal voltage differences with the preset threshold, if both $|U_{n(t-1)t}|$ and $|U_{nt(t+1)}|$ are greater than the preset threshold, to consider that the superconducting magnet located at the position n in the unit motor t is in the quench state.

It should be noted that relational terms such as first and second are used herein merely to distinguish one entity or operation from another entity or operation and do not necessarily require or imply the existence of any such actual relationship or sequence between these entities or operations. Moreover, the terms "include", "comprise", or any other variants thereof are intended to cover non-exclusive inclusion, so that a process, method, item, or device including a series of elements includes not only those elements but also other elements not explicitly listed, or further includes inherent elements of such process, method, item, or device. An element defined by "includes a . . . " does not, without more constraints, preclude the existence of additional identical elements in the process, method, article, or device that includes the element.

Various embodiments in this specification are all described in a related manner, for same or similar parts in the embodiments, mutual reference may be made. Each embodiment focuses on what is different from other embodiments. In particular, an apparatus embodiment is basically similar to a method embodiment, and therefore is described briefly. For related parts, reference may be made to partial descriptions in the method embodiment. For convenience of description, the aforementioned apparatus is functionally divided into various units/modules for separate explanation. It should be understood that when implementing the present invention, the functions of various units/modules can be realized in the same or more software and/or hardware.

The above are preferred embodiments of the present invention. It should be noted that, for those of ordinary skill in the art, a plurality of improvements and modifications can be made without departing from the principle of the present invention, and these improvements and modifications are also regarded to be within the scope of protection of the present invention.

What is claimed is:

1. A superconducting motor quench detection method based on rotational symmetry of a motor, comprising:

step 101: acquiring terminal voltages of each group of superconducting magnets in a superconducting motor, wherein the superconducting motor is pre-divided into at least two unit motors that are arranged symmetrically with respect to a rotational axis and have identical electromagnetic structures by using the rotational symmetry of the motor, and the superconducting magnets at corresponding symmetric positions in the at least two unit motors have same geometric structure; the superconducting magnets located at corresponding positions are selected from the at least two unit motors as a group of superconducting magnets; the terminal voltages are acquired in real time and the terminal voltage of each superconducting magnet is coupled with an induced voltage and induced voltage components in the two superconducting magnets have same variation process;

step 102: for each group of superconducting magnets, calculating the terminal voltage difference between adjacent unit motors in the same group, where magnetic fields passing through the superconducting magnets at the same position n in adjacent unit motors have same waveform and variation process, so that the induced voltage components in the terminal voltages of the two superconducting magnets have the same variation process and the induced voltage components are eliminated in the terminal voltage difference, then calculating an absolute value of a terminal voltage difference of each group of superconducting magnets; and step 103: judging whether the absolute value exceeds a preset threshold, and if the absolute value exceeds the preset threshold, determining that the superconducting magnets are in a quench state;

wherein comparing the obtained absolute values of the terminal voltage differences with the preset threshold, if both $|U_{n(t-1)t}|$ and $|U_{nt(t+1)}|$ are greater than the preset threshold, considering that the superconducting magnet located at the position n in the unit motor t is in the quench state, wherein $U_{nt(t+n)}$ is a difference between a terminal voltage of the superconducting magnet located at the position n in the unit motor t and a terminal voltage of a superconducting magnet located at a position n in a unit motor t+1.

2. The method according to claim 1, wherein the superconducting motor consists of T unit motors arranged at intervals of 360°/T and having a same structure, T is greater than or equal to 2, each unit motor has N superconducting magnets distributed from a position 1 to a position N, and the superconducting magnets located at the corresponding positions in each unit motor have a same geometric structure and are arranged at intervals of 360°/T in the superconducting motor.

3. The method according to claim 2, wherein the step 101 comprises:

dividing the superconducting magnets located at the corresponding positions in the T unit motors into a group, each unit motor having N superconducting magnets, dividing all superconducting magnets into N groups, each group of superconducting magnets consisting of T superconducting magnets, and subsequently acquiring the terminal voltages of each group of superconducting magnets in real time;

$$\text{a group 1:} \quad u_{11} \quad u_{12} \quad \ldots \quad u_{1t} \quad \ldots \quad u_{1T}$$

$$\text{a group 2:} \quad u_{21} \quad u_{22} \quad \ldots \quad u_{2t} \quad \ldots \quad u_{2T}$$

$$\vdots \quad \vdots \quad \vdots \quad \vdots \quad \vdots$$

$$\text{a group } n: \quad u_{n1} \quad u_{n2} \quad \ldots \quad u_{nt} \quad \ldots \quad u_{nT}$$

$$\vdots \quad \vdots \quad \vdots \quad \vdots \quad \vdots$$

$$\text{a group } N: \quad u_{N1} \quad u_{N2} \quad \ldots \quad u_{Nt} \quad \ldots \quad u_{NT}$$

wherein n represents the positions of the superconducting magnets located in the unit motors, t represents the unit motors where the superconducting magnets are located, and $u_{nt}$ is a terminal voltage of a superconducting magnet located at a position n in a unit motor t.

4. The method according to claim 3, wherein the step 102 comprises:

calculating N groups of terminal voltages of the superconducting magnets according to the following expression to obtain N groups of terminal voltage differences:

$$\text{a group 1:} \quad U_{112} = u_{11} - u_{12} \quad U_{123} = u_{12} - u_{13} \quad \ldots \quad U_{1t(t+1)} = u_{1t} - u_{1(t+1)} \quad \ldots \quad U_{1T1} = u_{1T} - u_{11}$$

$$\text{a group 2:} \quad U_{212} = u_{21} - u_{22} \quad U_{223} = u_{22} - u_{23} \quad \ldots \quad U_{2t(t+1)} = u_{2t} - u_{2(t+1)} \quad \ldots \quad U_{2T1} = u_{2T} - u_{21}$$

$$\vdots \quad \vdots \quad \vdots \quad \vdots \quad \vdots$$

$$\text{a group } n: \quad U_{n12} = u_{n1} - u_{n2} \quad U_{n23} = u_{n2} - u_{n3} \quad \ldots \quad U_{nt(t+1)} = u_{nt} - u_{n(t+1)} \quad \ldots \quad U_{nT1} = u_{nT} - u_{n1}$$

$$\vdots \quad \vdots \quad \vdots \quad \vdots \quad \vdots$$

$$\text{a group } N: \quad U_{N12} = u_{N1} - u_{N2} \quad U_{N23} = u_{N2} - u_{N3} \quad \ldots \quad U_{Nt(t+1)} = u_{Nt} - u_{N(t+1)} \quad \ldots \quad U_{NT1} = u_{NT} - u_{N1}$$

wherein $U_{nt(t+1)}$ is a difference between a terminal voltage of the superconducting magnet located at the position n in the unit motor t and a terminal voltage of a superconducting magnet located at a position n in a unit motor t+1;

subsequently calculating the absolute values of the terminal voltage differences to obtain:

$$\text{a group 1:} \quad |U_{112}| \quad |U_{123}| \quad \ldots \quad |U_{1t(t+1)}| \quad \ldots \quad |U_{1T1}|$$

$$\text{a group 2:} \quad |U_{212}| \quad |U_{223}| \quad \ldots \quad |U_{2t(t+1)}| \quad \ldots \quad |U_{2T1}|$$

$$\vdots \quad \vdots \quad \vdots \quad \vdots \quad \vdots$$

$$\text{a group } n: \quad |U_{n12}| \quad |U_{n23}| \quad \ldots \quad |U_{nt(t+1)}| \quad \ldots \quad |U_{nT1}|$$

$$\vdots \quad \vdots \quad \vdots \quad \vdots \quad \vdots$$

$$\text{a group } N: \quad |U_{N12}| \quad |U_{N23}| \quad \ldots \quad |U_{Nt(t+1)}| \quad \ldots \quad |U_{NT1}|$$

so as to obtain the absolute values of the terminal voltage differences.

5. A superconducting motor quench detection apparatus based on rotational symmetry of a motor, used for a superconducting motor, wherein the superconducting motor quench detection apparatus comprises:

an acquisition module, configured to acquire terminal voltages of each group of superconducting magnets in the superconducting motor, wherein the superconducting motor is pre-divided into at least two unit motors that are arranged symmetrically with respect to a rotational axis and have identical electromagnetic structures by using the rotational symmetry of the motor, and the superconducting magnets at corresponding symmetric positions in the at least two unit motors have the same geometric structure;

superconducting magnets located at corresponding positions are selected from the at least two unit motors as a group of superconducting magnets; the terminal voltages are acquired in real time and the terminal voltage of each superconducting magnet is coupled with an induced voltage and induced voltage components in the two superconducting magnets have same variation process;

a calculation module, configured to calculate the terminal voltage difference between adjacent unit motors in the same group, where magnetic fields passing through the superconducting magnets at the same position n in adjacent unit motors have same waveform and variation process, so that the induced voltage components in the terminal voltages of the two superconducting magnets have the same variation process and the induced voltage components are eliminated in the terminal voltage difference, then calculate an absolute value of a terminal voltage difference of each group of superconducting magnets; and a judgment module, configured to judge whether the absolute value exceeds a preset threshold, and if the absolute value exceeds the preset threshold, to determine that the superconducting magnets are in a quench state;

wherein comparing the obtained absolute values of the terminal voltage differences with the preset threshold, if both $|U_{n(t-1)t}|$ and $|U_{nt(t+1)}|$ are greater than the preset threshold, considering that the superconducting magnet located at the position n in the unit motor t is in the quench state, wherein $U_{nt(t+1)}$ is a difference between a terminal voltage of the superconducting magnet located at the position n in the unit motor t and a terminal voltage of a superconducting magnet located at a position n in a unit motor t+1.

6. The apparatus according to claim 5, wherein the superconducting motor consists of T unit motors arranged at intervals of 360°/T and having a same structure, T is greater than or equal to 2, each unit motor has N superconducting magnets distributed from a position 1 to a position N, and the superconducting magnets located at the corresponding positions in each unit motor have a same geometric structure and are arranged at intervals of 360°/T in the superconducting motor.

7. The apparatus according to claim 6, wherein the acquisition module comprises:

an acquisition sub-module, configured to divide the superconducting magnets located at the corresponding positions in the T unit motors into a group, each unit motor having N superconducting magnets, to divide all super-conducting magnets into N groups, each group of superconducting magnets consisting of T supercon-ducting magnets, and to subsequently acquire the ter-minal voltages of each group of superconducting mag-nets in real time:

$$
\begin{array}{llllll}
\text{a group 1:} & u_{11} & u_{12} & \ldots & u_{1t} & \ldots & u_{1T} \\
\text{a group 2:} & u_{21} & u_{22} & \ldots & u_{2t} & \ldots & u_{2T} \\
& \vdots & \vdots\ \vdots & & \vdots & & \vdots \\
\text{a group } n: & u_{n1} & u_{n2} & \ldots & u_{nt} & \ldots & u_{nT} \\
& \vdots & \vdots\ \vdots & & \vdots & & \vdots \\
\text{a group } N: & u_{N1} & u_{N2} & \ldots & u_{Nt} & \ldots & u_{NT}
\end{array}
$$

wherein n represents the positions of the superconducting magnets located in the unit motors, t represents the unit motors where the superconducting magnets are located, and $u_{nt}$ is a terminal voltage of a superconducting magnet located at a position n in a unit motor t.

8. The apparatus according to claim 7, wherein the calculation module comprises:
   a calculation sub-module, configured to calculate N groups of terminal voltages of the superconducting magnets according to the following expression to obtain N groups of terminal voltage differences:

$$
\begin{array}{llllll}
\text{a group 1:} & U_{112} = u_{11} - u_{12} & U_{123} = u_{12} - u_{13} & \ldots & U_{1t(t+1)} = u_{1t} - u_{1(t+1)} & \ldots & U_{1T1} = u_{1T} - u_{11} \\
\text{a group 2:} & U_{212} = u_{21} - u_{22} & U_{223} = u_{22} - u_{23} & \ldots & U_{2t(t+1)} = u_{2t} - u_{2(t+1)} & \ldots & U_{2T1} = u_{2T} - u_{21} \\
& \vdots & \vdots & & \vdots & & \vdots \\
\text{a group } n: & U_{n12} = u_{n1} - u_{n2} & U_{n23} = u_{n2} - u_{n3} & \ldots & U_{nt(t+1)} = u_{nt} - u_{n(t+1)} & \ldots & U_{nT1} = u_{nT} - u_{n1} \\
& \vdots & \vdots & & \vdots & & \vdots \\
\text{a group } N: & U_{N12} = u_{N1} - u_{N2} & U_{N23} = u_{N2} - u_{N3} & \ldots & U_{Nt(t+1)} = u_{Nt} - u_{N(t+1)} & \ldots & U_{NT1} = u_{NT} - u_{N1}
\end{array}
$$

wherein $U_{nt(t+1)}$ is a difference between a terminal voltage of the superconducting magnet located at the position n in the unit motor t and a terminal voltage of a super-conducting magnet located at a position n in a unit motor t+1;
to subsequently calculate the absolute values of the ter-minal voltage differences to obtain:

$$
\begin{array}{llllll}
\text{a group 1:} & |U_{112}| & |U_{123}| & \ldots & |U_{1t(t+1)}| & \ldots & |U_{1T1}| \\
\text{a group 2:} & |U_{212}| & |U_{223}| & \ldots & |U_{2t(t+1)}| & \ldots & |U_{2T1}|
\end{array}
$$

-continued $$
\begin{array}{llllll}
& \vdots & \vdots\ \vdots & & \vdots & & \vdots \\
\text{a group } n: & |U_{n12}| & |U_{n23}| & \ldots & |U_{nt(t+1)}| & \ldots & |U_{nT1}| \\
& \vdots & \vdots\ \vdots & & \vdots & & \vdots \\
\text{a group } N: & |U_{n12}| & |U_{N23}| & \ldots & |U_{Nt(t+1)}| & \ldots & |U_{NT1}|
\end{array}
$$

so as to obtain the absolute values of the terminal voltage differences.

\* \* \* \* \*